US008322879B2

(12) United States Patent
Abe

(10) Patent No.: US 8,322,879 B2
(45) Date of Patent: Dec. 4, 2012

(54) MULTI-WAVELENGTH SEMICONDUCTOR LASER DEVICE

(75) Inventor: Shinji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 365 days.

(21) Appl. No.: 12/753,136

(22) Filed: Apr. 2, 2010

(65) Prior Publication Data

US 2010/0265702 A1    Oct. 21, 2010

(30) Foreign Application Priority Data

Apr. 15, 2009  (JP) .................................. 2009-098949

(51) Int. Cl.
| F21V 9/00 | (2006.01) |
| H01S 5/00 | (2006.01) |
| H01L 23/48 | (2006.01) |

(52) U.S. Cl. ...................... 362/231; 372/50.12; 257/690

(58) Field of Classification Search .......................... None
See application file for complete search history.

(56) References Cited

U.S. PATENT DOCUMENTS

| 5,648,977 A | 7/1997 | Miyazaki |
| 5,668,822 A | 9/1997 | Tada |
| 7,376,166 B2 | 5/2008 | Hata et al. |

FOREIGN PATENT DOCUMENTS

| CN | 1838494 A | 9/2006 |
| JP | 7-147463 A | 6/1995 |
| JP | 8-051247 A | 2/1996 |
| JP | 8-111562 A | 4/1996 |
| JP | 11-186658 A | 7/1999 |
| JP | 11-186669 A | 7/1999 |
| JP | 2006-059471 A | 3/2006 |

OTHER PUBLICATIONS

State Intellectual Property Office of the People's Republic of China, English language translation of first Office Action in Chinese Patent Application No. 201010165214.6 (Jun. 24, 2011).

*Primary Examiner* — Anh Mai
*Assistant Examiner* — Britt D Hanley
(74) *Attorney, Agent, or Firm* — Leydig, Voit & Mayer, Ltd.

(57) ABSTRACT

A multi-wavelength semiconductor laser device includes a plate stem; a prism shaped submount with a bottom face on a face of the stem; laser diodes having emission wavelengths different from each other are mounted on lateral sides of the submount so that their respective emission points are positioned at substantially the same distance from a center axis of the stem; and lead pins penetrating the stem are located along and opposite edge lines between adjacent pairs of the lateral sides of the submount.

7 Claims, 3 Drawing Sheets

MULTI-WAVELENGTH SEMICONDUCTOR LASER DEVICE

BACKGROUND OF THE INVENTION

1. Field of the Invention

The present invention relates to a multi-wavelength semiconductor laser device that emits different wavelength light beams.

2. Description of the Prior Art

An optical disc such as a compact disc (CD), a digital versatile disc (DVD), and a "Blu-ray Disc"™ (BD) has been increasingly used now as large capacity storage media. Laser diodes used for reading/writing from/to these discs have respective different emission wavelengths: a CD laser diode has an emission wavelength of 780 nm band (infrared), a DVD laser diode has an emission wavelength of 650 nm band (red), and a BD laser diode has an emission wavelength of 405 nm band (blue-violet). Hence, in order to treat data for a CD, a DVD, and a BD in a single optical disc drive, required are three light sources of infrared, red, and blue-violet.

There has been a conventional multi-wavelength semiconductor laser device in which a red laser diode and an infrared laser diode are arranged in parallel and bonded on a blue-violet laser diode mounted on a heat sink, to be able to treat data for a CD, DVD, and BD in a single optical disc drive (see, for example, JP 2006-59471A (FIG. 4)). There has also been a multi laser diode array that is configured by mounting a plurality of laser diodes on a bendable submount plate and then bending the submount plate in a triangular prism shape so that the mounted laser diodes are arranged inside thereof, to thereby position the light sources of the laser diodes close to each other (see, for example, JP 08-111562A (FIG. 2)).

In the multi-wavelength semiconductor laser device disclosed in JP 2006-59471A, however, since the infrared and the red laser diodes are arranged and bonded on the blue-violet laser diode, there has been a problem in that heat generated during operation of the infrared and the red laser diodes cannot be efficiently dissipated to the heat sink. Moreover, the emission points of the infrared, the red, and the blue-violet laser diodes are difficult to be positioned at the same distance from the center of the laser device package, resulting in a problem of complicating their optical design.

In the laser diode array disclosed in JP 08-111562A, on the other hand, the respective emission points of the laser diodes can be positioned at the same distance from the center of the laser device package. However, since the laser diodes are arranged on the inside of the submount plate bent in the triangular prism shape, there has been problems of complicating wiring to the laser diodes and requiring longer time in the wiring process.

SUMMARY OF THE INVENTION

The present invention is made to resolve such problems as mentioned above, and provides a multi-wavelength semiconductor laser device that is easy in optical design and excellent in heat dissipation, and easy to manufacture.

A multi-wavelength semiconductor laser device according to the invention includes a plate stem; a prism shaped submount whose bottom face is fixed to a face of the stem; a plurality of laser diodes having emission wavelengths different from each other, each being mounted on lateral sides of the submount so that their respective emission points are positioned at substantially the same distance from the center axis of the stem; and lead pins penetrating the stem to be arranged in positions opposite to edge lines between lateral sides of the submount.

According to the invention, a multi-wavelength semiconductor laser device can be realized that is easy in optical design and excellent in heat dissipation, and easy to manufacture.

DESCRIPTION OF THE PREFERRED EMBODIMENTS

Embodiment 1

Embodiment 1 of the present invention will be described with reference to FIGS. 1 and 2.

Figure 1:
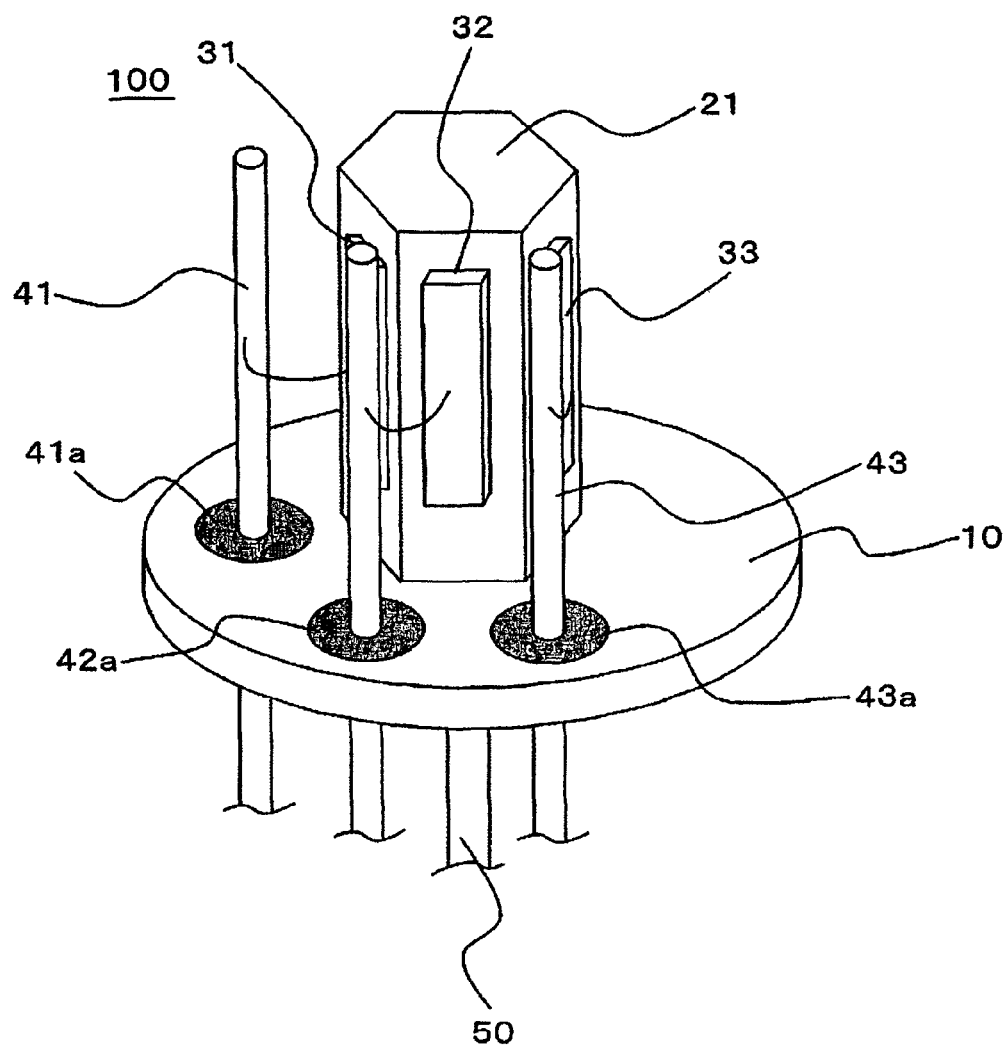
FIG. 1 is an oblique perspective view illustrating a configuration of a multi-wavelength semiconductor laser device in Embodiment 1 of the present invention.
Figure 2:
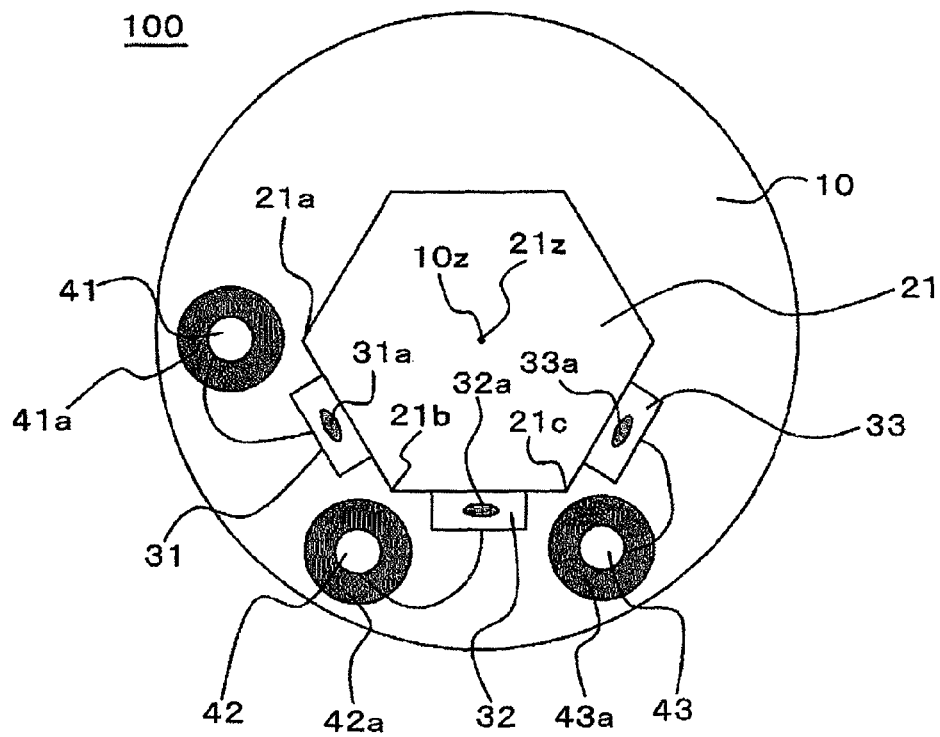
FIG. 2 is a plan view illustrating the configuration of the multi-wavelength semiconductor laser device of Embodiment 1.

Referring to FIG. 1, a multi-wavelength semiconductor laser device 100 is provided with a stem 10 that is formed of a metal plate in a disc shape, a regular hexagonal prism shaped submount 21 whose bottom face is placed on the top face of the stem 10, three laser diodes 31, 32, and 33 each are mounted on lateral sides of the submount 21, three lead pins 41, 42, and 43 that penetrate through the stem 10 and are arranged along and opposite to edge lines 21a, 21b, and 21c between lateral sides of the submount 21, respectively, and a ground pin 50 that is joined to the stem 10. It is noted that the stem 10 is aligned so that its center axis $10z$ coincides substantially with the center of a semiconductor laser package (not shown) including the multi-wavelength semiconductor laser device 100.

The submount 21 is formed of a metal material having high thermal conductivity, such as copper alloy, and aligned so that its center axis $21z$ coincides with the center axis $10z$ of the stem 10. In addition, the edge lines of the submount 21 are not necessarily formed in a sharp edge but may be in a chamfered or a rounded edge.

The three laser diodes 31 to 33 are arranged respectively on center portions of three contiguous lateral sides of the submount 21 and fixed thereto by soldering, so that their respective emitting points 31a, 32a, 33a are positioned at substantially the same distance from the center axis $10z$ of the stem 10 and aligned to emit respective laser beams in a direction parallel to the stem center axis $10z$ and the submount center axis $21z$. The laser diodes 31 to 33 have emission wavelengths of 780 nm band (infrared), 650 nm band (red), and 405 nm band (blue-violet), respectively, and their arranging order is not limited. It is noted that the statement of "substantially the same distance" means that assembly tolerance and the like acceptable from the optical design are allowed to exist.

The lead pins 41 to 43 penetrate through the stem 10 via insulators 41a to 43a and are arranged around the submount 21 along and opposite to its edge lines 21a to 21c, respectively. Preferably, the lead pins 41 to 43 are arranged in rotational symmetry with respect to the center axis 21z of the submount 21. By arranging the lead pins 41 to 43 in such symmetrical positions, wire-bonding across the lead pins 41 to 43 and the laser diodes 31 to 33 is easily performed by rotating, about the submount center axis 21z, the submount 21 to which the laser diodes 31 to 33 are soldered. In this way, electrical connection is made between the lead pins 41 to 43 and the p-side electrodes (not shown) of the laser diodes 31 to 33.

The ground pin 50 is joined to the stem 10 by welding and electrically connected to the n-side electrodes (not shown) of the laser diodes 31 to 33 through the stem 10 and the submount 21.

By thus configuring the multi-wavelength semiconductor laser device 100, the respective emission points 31a to 33a of the laser diodes 31 to 33 can be positioned at substantially the same distance from the center axis 10z of the stem 10, i.e., the center of the semiconductor laser package, therefore making it easy to design the optical system including the multi-wavelength semiconductor laser device 100.

In particular, since the submount 21 is formed in a regular hexagonal prism shape and aligned so that the submount center axis 21z substantially coincides with the center axis 10z of the discoid stem 10, the respective emission points 31a to 33a of the laser diodes 31 to 33 are easily positioned at the same distance from the stem center axis 10z.

Moreover, since the three laser diodes 31 to 33 are all soldered to the submount 21, heat generated during their operation can be efficiently dissipated externally through the submount 21.

Furthermore, by arranging the lead pins 41 to 43 along and opposite to the edge lines 21a to 21c of the submount 21, wire bonding across the lead pins 41 to 43 and the laser diodes 31 to 33 is easily performed, thereby reducing the wiring process time by a larger amount compared to prior arts and making it easy to manufacture the multi-wavelength semiconductor laser device 100.

In particular, by arranging the lead pins 41 to 43 in rotational symmetry with respect to the center axis 21z of the submount 21, the wire bonding can be performed more easily.

Figure 3:
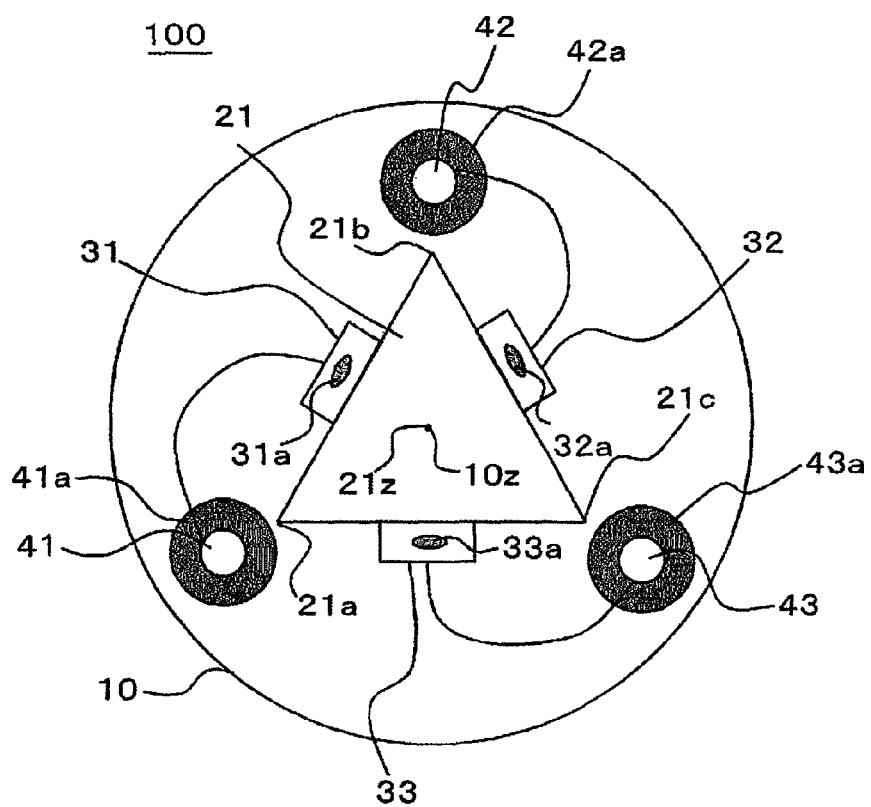
FIG. 3 is a plan view illustrating a modified configuration of the multi-wavelength semiconductor laser device of Embodiment 1.

While the submount 21 is formed in a regular hexagonal prism shape in this embodiment, it is not limited to the regular hexagonal prism shape but may be formed in a regular n-polygonal prism shape (n is an integer of three or more), for example, the submount 21 may be formed, as shown in FIG. 3, in a regular triangular prism shape and aligned so that its center axis 21z coincides with the stem center axis 10z. With this configuration of the submount 21, the respective emission points 31a to 33a of the laser diodes 31 to 33 can be positioned close to the stem center axis 10z, i.e., the center of the semiconductor laser package, thereby making it easier to design the optical system including the multi-wavelength semiconductor laser device 100.

Note that the submount 21 does not necessarily have a regular polygonal prism shape as long as the respective emission point 31a to 33a of the diodes 31 to 33 can be positioned at substantially the same distance from the stem center axis 10z, i.e., the center of the semiconductor laser package. Additionally, the edge lines are not necessarily formed in a sharp edge but may be in a chamfered or a rounded edge.

According to this embodiment, a multi-wavelength semiconductor laser device 100 includes a plate stem 10; a prism shaped submount 21 whose bottom face is placed on a face of the stem 10; a plurality of laser diodes 31, 32, 33 whose emission wavelengths are different from each other are each mounted on lateral sides of the submount 21 so that their respective emission points 31a, 32a, 33a are positioned at substantially the same distance from the center axis 10z of the stem 10; and lead pins 41, 42, 43 that penetrate through the stem 10 and are arranged along and opposite to edge lines 21a, 21b, 21c of the submount 21, respectively. Therefore, a multi-wavelength semiconductor laser device is realized that is easy in optical design and excellent in heat dissipation, and easy to manufacture.

Embodiment 2

Embodiment 2 of the invention will be described with reference to FIG. 4. A multi-wavelength semiconductor laser device in this embodiment includes a two-wavelength laser diode as one of a plurality of laser diodes.

Figure 4:
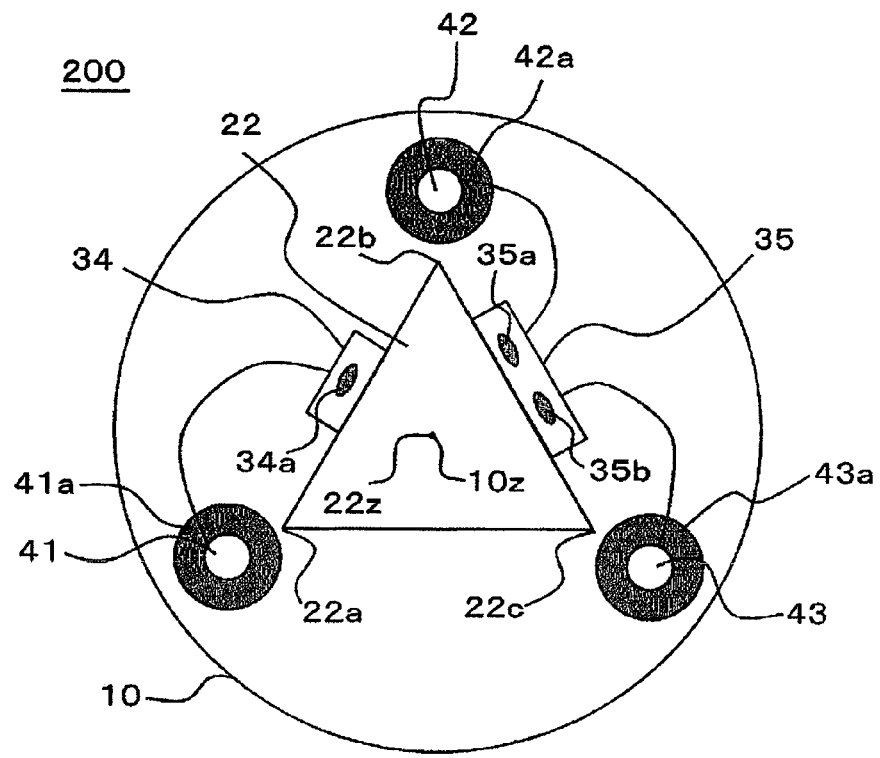
FIG. 4 is a plan view illustrating a configuration of a multi-wavelength semiconductor laser device in Embodiment 2 of the invention.

Referring to FIG. 4, a multi-wavelength semiconductor laser device 200 is provided with a stem 10 that is formed of a metal plate in a disc shape, a regular triangular prism shaped submount 22 whose bottom face is placed on the top face of the stem 10, two laser diodes 34 and 35 that are mounted on lateral sides of the submount 22, three lead pins 41, 42, and 43 that penetrate through the stem 10 and are arranged along and opposite to the edge lines 22a, 22b, and 22c of the submount 22, respectively, and a ground pin 50 that is joined to the stem 10. It is noted that the center axis 10z of the stem 10 is aligned to coincide substantially with the center of a semiconductor laser package (not shown) including the multi-wavelength semiconductor laser device 200.

The submount 22 is formed, as with Embodiment 1, of a metal material having high thermal conductivity, such as copper alloy, and its center axis 22z is aligned to coincide with the center axis 10z of the stem 10.

Among the two laser diodes 34, 35, the laser diode 34 is a single-wavelength laser diode that has an emission wavelength of 405 nm band (blue-violet) and the other laser diode 35 is a two-wavelength laser diode that is capable of emitting laser beams whose wavelengths are a 780 nm band (infrared) and a 650 nm band (red). These laser diodes are arranged respectively on central portions of two lateral sides of the submount 22 and fixed thereto by soldering, so that the emission point 34a of the single wavelength laser diode 34 and the two emission points 35a, 35b of the two-wavelength laser diode 35 are positioned at substantially the same distance with respect to the center axis 10z of the stem 10, and that each laser beam of the laser diodes 34, 35 is emitted in parallel to the stem center axis 10a and the submount center axis 21z.

The lead pins 41 to 43 penetrate the stem 10 via insulators 41a to 43a and are arranged around the submount 22 along and opposite to its edge lines 22a to 22c, respectively. Preferably, the lead pins 41 to 43 are arranged in rotational symmetry with respect to the center axis 22z of the submount 22. By arranging the lead pins 41 to 43 in such symmetrical positions, wire-bonding across the lead pins 41 to 43 and the laser diodes 34, 35 is easily performed by rotating, about the submount center axis 22z, the submount 22 to which the laser diodes 34, 35 are soldered. In this way, electrical connection is made between the lead pins 41 to 43 and the p-side electrodes (not shown) of the laser diodes 34, 35.

As with Embodiment 1, a ground pin 50 is joined to the stem 10 by welding and electrically connected to the n-side electrodes (not shown) of the laser diodes 34, 35 through the stem 10 and the submount 22.

By thus configuring the multi-wavelength semiconductor laser device 200, the emission point 34a of the single-wavelength laser diode 34 and the emission points 35a, 35b of the two-wavelength laser diode 35, can be positioned at substantially the same distance from the center axis 10z of the stem 10, i.e., the center of the semiconductor laser package, therefore making it easy to design the optical system including the multi-wavelength semiconductor laser device 200.

In particular, since the submount 22 is formed in a regular triangular prism shape and aligned so that the submount center axis 22z substantially coincides with the center axis 10z of the discoid stem 10, the respective emission points 34a, 35a, 35b of the laser diodes 34, 35 are easily positioned at the same distance with respect to the stem center axis 10z.

Moreover, since both laser diodes 34, 35 are soldered to the submount 22, heat generated during their operation can be efficiently dissipated externally through the submount 22.

Furthermore, by arranging the lead pins 41 to 43 along and opposite to the edge lines 22a to 22c of the submount 22, wire bonding across the lead pins 41 to 43 and the laser diodes 34, 35 is easily performed, thereby reducing wiring process time by a larger amount compared to prior arts and making it easy to manufacture the multi-wavelength semiconductor laser device 200.

In particular, by arranging the lead pins 41 to 43 in rotational symmetry with respect to the center axis 22z of the submount 22, the wire bonding can be performed more easily.

According to this embodiment, a multi-wavelength semiconductor laser device 200 includes a plate stem 10; a prism shaped submount 22 whose bottom face is placed on a face of the stem 10; a plurality of laser diodes 34, 35 whose emission wavelengths are different from each other are each mounted on lateral sides of the submount 22, so that their respective emission points 34a, 34a, 35b are positioned at substantially the same distance from the center axis 10z of the stem 10; and lead pins 41, 42, 43 that penetrate through the stem 10 and are arranged along and opposite to edge lines 22a, 22b, 22c of the submount 22, respectively. Therefore, a multi-wavelength semiconductor laser device is realized that is easy in optical design and excellent in heat dissipation, and easy to manufacture.

Embodiment 3

Embodiment 3 of the invention will be described with reference to FIG. 5. A multi-wavelength semiconductor laser device in this embodiment includes a two-wavelength laser diode as one of a plurality of laser diodes, and is configured such that the laser diodes are arranged near an edge line of a submount to position their respective emission points close to the center of a semiconductor laser package of the laser device.

Figure 5:
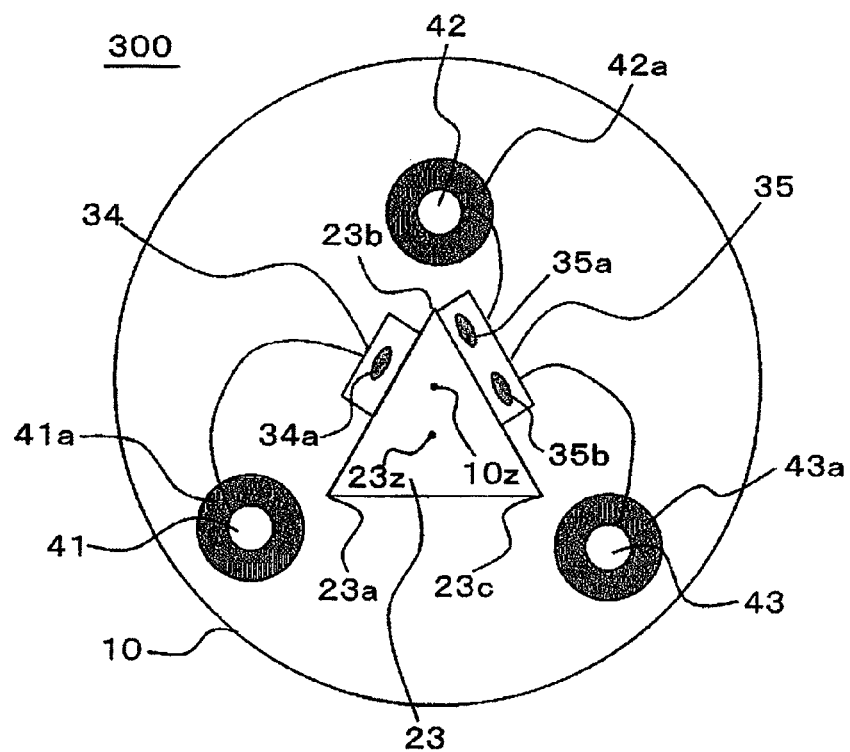
FIG. 5 is a plan view illustrating a configuration of a multi-wavelength semiconductor laser device in Embodiment 3 of the invention.

Referring to FIG. 5, a multi-wavelength semiconductor laser device 300 is configured such that a single-wavelength laser diode 34 that emits a blue-violet laser beam and a two-wavelength laser diode 35 that emits red and infrared laser beams, are mounted on two lateral sides and near the edge line 23b of the sides of a regular triangular prism shaped submount 23. Not that the respective emission points 34a, 35a, 35b of the laser diodes are positioned at substantially the same distance from the center axis 10z of a stem 10, i.e., the center of the semiconductor laser package. Except for these features, the multi-wavelength semiconductor laser device 300 of Embodiment 3 has a configuration similar to the multi-wavelength semiconductor laser device 200 of Embodiment 2.

By thus configuring the multi-wavelength semiconductor laser device 300, the emission point 34a of the single-wavelength laser diode 34 and the emission points 35a, 35b of the two-wavelength laser diode 35 can be brought closer to the center axis 10z of the stem 10, i.e., the center of the semiconductor laser package while keeping substantially the same the distance between the respective emission points 34a, 35a, 35b of the laser diodes 34, 35 and the center of the semiconductor laser package, therefore making it easy to design the optical system including the multi-wavelength semiconductor laser device 300.

According to this embodiment, a multi-wavelength semiconductor laser device 300 includes a plate stem 10, a prism shaped submount 23 whose bottom face is placed on a face of the stem 10, a plurality of laser diodes 34, 35 whose emission wavelengths are different from each other is each mounted on lateral sides of the submount 23, and lead pins 41, 42, 43 that penetrate through the stem 10 and are arranged along and opposite to edge lines 23a, 23b, 23c of the submount 23 respectively, and is configured such that the laser diodes 34, 35 are arranged near the center axis 10z of the stem 10 and their respective emission points 34a, 35a, 35b are positioned at substantially the same distance from the stem center axis 10z, and the lead pins 41, 42, 43 are arranged in rotational symmetry. Therefore, a multi-wavelength semiconductor laser device is realized that is easy in optical design and excellent in heat dissipation, and easy to manufacture.

In addition, the present invention is, as a matter of course, not limited to the above embodiments but includes various modifications and developments within the scope of spirits of the invention.

What is claimed is:

1. A multi-wavelength semiconductor laser device comprising:
   a stem having a face and a center axis transverse to the face;
   a prism shaped submount having a bottom face on the face of the stem and external lateral sides transverse to the bottom face;
   a plurality of laser diodes having emission wavelengths different from each other, each laser diode being mounted on a distinctive lateral side of the submount; and
   lead pins penetrating the stem and arranged along and opposite edge lines of the submount, which are located between adjacent pairs of the external lateral sides of the submount, wherein respective emission points of the laser diodes are positioned at substantially the same distance from the center axis of the stem.

2. The multi-wavelength semiconductor laser device of claim 1, wherein the submount has a cross section, transverse to the center axis of the stern, that has the shape of a regular polygon.

3. The multi-wavelength semiconductor laser device of claim 1, wherein the submount has a cross section, transverse to the center axis of the stern, that has the shape of a regular triangle.

4. The multi-wavelength semiconductor laser device of claim 1, wherein the lead pins are arranged in rotational symmetry with respect to the center axis of the submount.

5. The multi-wavelength semiconductor laser device of claim 1, wherein the submount has a center axis and the center axis of the submount and the center axis of the stem are coincident.

6. The multi-wavelength semiconductor laser device of claim 1, wherein at least one of the plurality of laser diodes is a two-wavelength laser diode producing laser light at two different wavelengths.

7. The multi-wavelength semiconductor laser device of claim 6, wherein each of the laser diodes is located near an edge line of the external lateral sides of the submount.

* * * * *